United States Patent [19]
Sher et al.

[11] Patent Number: 6,157,204
[45] Date of Patent: Dec. 5, 2000

[54] BUFFER WITH ADJUSTABLE SLEW RATE AND A METHOD OF PROVIDING AN ADJUSTABLE SLEW RATE

[75] Inventors: Joseph C. Sher, Meridian; Manny K. F. Ma, Boise, both of Id.

[73] Assignee: Micron Technology, Inc., Boise, Id.

[21] Appl. No.: 09/129,655

[22] Filed: Aug. 5, 1998

[51] Int. Cl.[7] ............................. H03K 17/16; H03K 5/12
[52] U.S. Cl. ................................. 326/21; 326/21; 326/17; 326/83; 326/86; 327/170; 327/525
[58] Field of Search .................................. 326/17, 21, 82, 326/83, 86, 56, 57, 58, 62; 327/170, 525

[56] References Cited

U.S. PATENT DOCUMENTS

| | | |
|---|---|---|
| 4,250,410 | 2/1981 | Moench et al. . |
| 4,567,378 | 1/1986 | Raver . |
| 4,717,912 | 1/1988 | Harvey et al. . |
| 4,797,579 | 1/1989 | Lewis . |
| 5,010,256 | 4/1991 | Dicke . |
| 5,017,813 | 5/1991 | Galbraith et al. . |
| 5,276,364 | 1/1994 | Wellheuser ............................... 307/475 |
| 5,537,070 | 7/1996 | Risinger . |
| 5,568,081 | 10/1996 | Lui et al. . |
| 5,592,104 | 1/1997 | Bach ......................................... 326/27 |
| 5,623,216 | 4/1997 | Penza et al. . |
| 5,818,285 | 10/1998 | Lee et al. ................................ 327/525 |
| 5,926,034 | 7/1999 | Seyyedy ................................... 326/37 |
| 5,929,691 | 7/1999 | Kim et al. ............................... 327/525 |
| 5,933,026 | 8/1999 | Larsen et al. ............................ 326/81 |

*Primary Examiner*—Michael Tokar
*Assistant Examiner*—Vibol Tan
*Attorney, Agent, or Firm*—Kirkpatrick & Lockhart LLP

[57] ABSTRACT

A buffer with an adjustable slew rate, including a current driver having an input terminal and an enable circuit connected to the input terminal to selectively enables the current driver. In one embodiment, the current driver includes an input terminal and the enable circuit includes a memory element, the state of which is used to activate the enable signal, a read circuit which reads the state of the memory element, a latch which latches the signal from the read circuit, and an output circuit connected to the input terminal of the current driver which provides a signal which selectively enables the current driver to adjust the slew rate.

17 Claims, 8 Drawing Sheets

BUFFER WITH ADJUSTABLE SLEW RATE AND A METHOD OF PROVIDING AN ADJUSTABLE SLEW RATE

CROSS REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention is directed generally to a buffer and, more particularly, to a buffer with adjustable slew rate and a method of providing an adjustable slew rate.

2. Description of the Background

Slew rate is a ratio of a rise or fall in voltage to the amount of time that rise or fall takes. Consequently, slew rate is a quantity which can be a controlling factor in the performance characteristics of a device. A device having a low slew rate can degrade the performance and speed of a system containing the device, while a device having a high slew rate may not allow the system to react to changes in the state of the device, and thereby cause breakdown of the system.

Those effects of slew rate have led manufacturers of processors and computer systems, such as Intel, to specify performance windows into which device slew rate characteristics must fall in order to properly operate with their processors and computer systems. However, process variations between different fabrication processes can cause large variations in device characteristics, such as drain to source current. For example, drain to source current characteristics for a p-channel fabrication have been shown to vary as much as 48%, depending upon the manufacturing process used to create the device. Such variations in device characteristics make it difficult, if not impossible, to insure that a device will exhibit slew rate characteristics within the performance window as set forth by the computer manufacturer.

Therefore, the need exists for a buffer that allows adjustment of slew rate characteristics after a circuit or device has been manufactured.

BRIEF SUMMARY OF THE INVENTION

The present invention is directed to an apparatus for adjusting slew rate. The apparatus includes a current driver having an input terminal and an enable circuit connected to the input terminal to selectively enable the current driver.

In one embodiment of the present invention, the current driver includes an input terminal and the enable circuit includes a memory element, the state of which is used to activate the enable signal, a read circuit which reads the state of the memory element, a latch which latches the signal from the read circuit, and an output circuit connected to the input terminal of the current driver and which provides a signal which selectively enables the current driver.

The present invention may be used to adjust the slew rate of a device, such as a memory device or a processor device. The present invention may also be used to adjust the slew rate of a system including a device, such as a memory device or a processor.

The present invention is also directed to a method of adjusting slew rate of a device including a current driver. The method includes providing a memory element having a state and providing to the current driver an enable signal indicative of the state of the memory element.

The present invention solves problems experienced with the prior art, such as the inability to adjust slew rate to overcome fabrication process variations, because the programmable capabilities of the present invention allow adjustment of the slew rate. That adjustment will allow buffers to meet the specifications of PC manufacturers in PC related applications, thereby allowing buffers to advance to meet the needs of next-generation PC technology.

Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements found in a typical circuit or device. Those of ordinary skill in the art will recognize that other elements may be desirable and/or required in order to implement the present invention. However, because such elements are well known in the art, and because they do not facilitate a better understanding of the present invention, a discussion of such elements is not provided herein. Furthermore, the figures and description herein illustrate and describe certain signals. When those signals are followed by an asterisk ("*"), it indicates that the signal is a logical complement of a signal having the same designation but without the asterisk. For example, signal QED* is the logical complement of signal QED.

Additionally, the figures and descriptions herein reference certain voltage types. As used herein, VCCX is an externally supplied voltage, such as about three volts which may vary between about 2.5 volts and about 3.6 volts. VCCR is a regulated internal voltage that is maintained at a substantially constant value and serves as the reference for other internal voltages. VCCR may be about 2.7 volts. VCCP is an internal pump voltage which exceeds both VCCX and VCCR, and may be about 4.2 volts. VBB is a substrate voltage and may be about −1 volts.

Figure 1:
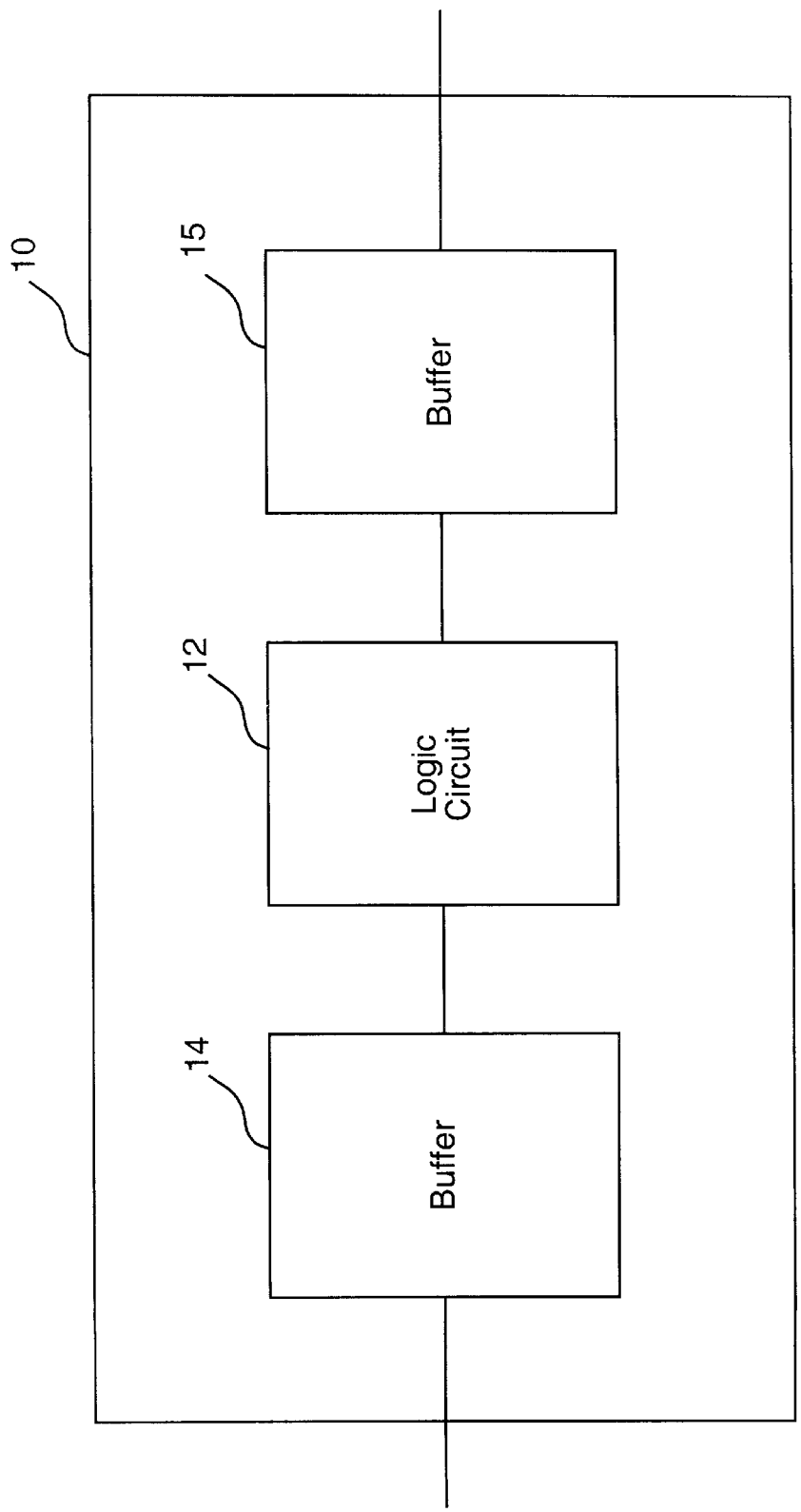
FIG. 1 is a high-level block diagram illustrating buffers and a logic circuit.

FIG. 1 is a high-level block diagram illustrating a device 10, which includes a logic circuit 12, an input buffer 14, and an output buffer 15. The logic circuit 12 may be, for example, a processing unit or a memory array. The device 10 may be, for example, a processor or a memory device.

Figure 2:
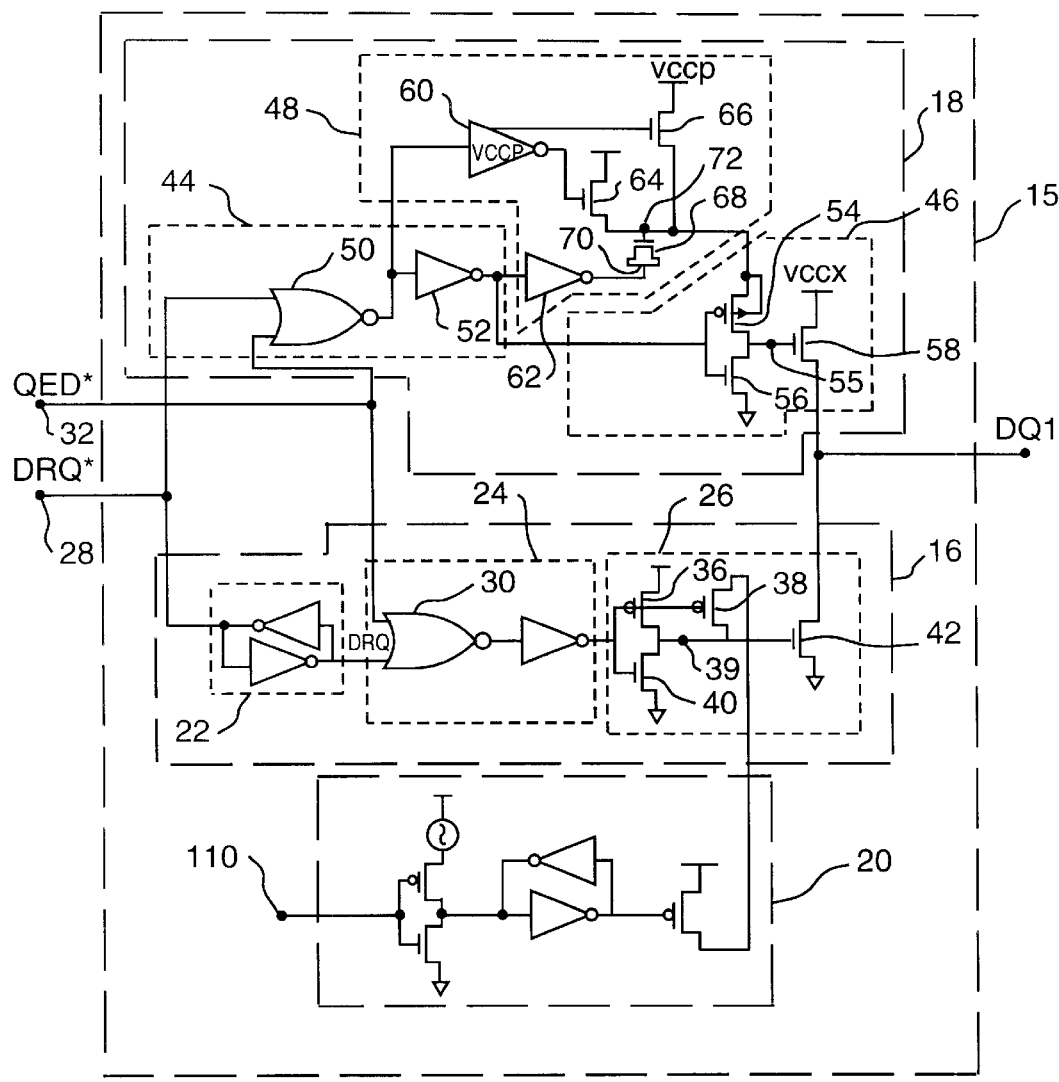
FIG. 2 is a circuit schematic illustrating an output buffer including an enable circuit.

FIG. 2 is a circuit schematic illustrating the buffer 15 including a pull-down circuit 16, a pull-up circuit 18, and an enable circuit 20. The present invention will be described herein with respect to the output buffer 15, but those skilled in the art will realize that the present invention may be utilized with other types of buffers, such as the input buffer 14.

The pull-down circuit 16 includes a latch 22, a logic circuit 24, and an output circuit 26. The pull-down circuit 16 receives a data signal DRQ* at an input terminal 28, and selectively pulls down the voltage of output terminal DQ1.

A latch 22 holds and inverts the data signal DRQ*, and provides an inverted signal DRQ to the logic circuit 24.

The logic circuit includes a NOR gate 30 that receives signal DRQ and also receives an enable signal QED* from an input terminal 32. In the illustrated embodiment, when signal QED* has a high value, the buffer 15 is disabled. In contrast, when signal QED* has a low value, the buffer 15 is enabled. The NOR gate 30 provides an output signal to an inverter 34, which provides a signal to the output circuit 26.

The output circuit 26 includes a first current driver 36 and a second current driver 38, which provide current to the node 39. A third current driver 40 removes current from the node 39. The voltage at the node 39 controls an output current driver 42. The output circuit 26 receives a signal from the inverter 34 and provides that signal to the gates of the first, second, and third current drivers 36, 38, 40. A low signal will cause current to flow through the first and second current drivers 36, 38, pulling up the voltage at the node 39. When the voltage at the node 39 is high, the output current driver 42 will conduct current, pulling down the voltage at output terminal DQ1. In contrast, a high signal from the logic circuit 24 will cause the current to flow through the third current driver 40, decreasing the voltage at the node 39. A low voltage at the node 39 will place the output current driver 42 in a non-conducting state, thereby preventing the signal at output terminal DQ1 from being pulled down.

The first and third current drivers 36, 40 provide for basic control of the output circuit, while the second current driver 38 allows for adjustment of the pull-down slew rate of the buffer 15. The second current driver 38 is enabled by the enable circuit 20 and, when the second current driver 38 is enabled and the signal provided by the logic circuit 24 to the output circuit 26 is a low signal, the second current driver 38 will provide additional current at the node 39, thereby causing the voltage at the node 39 to increase more quickly. The increased current provided to the node 39 by the second current driver 38 increases the speed at which the output current driver 42 is activated. As a result, by selectively enabling the second current driver 38, the pull-down slew rate of the buffer 15 may be adjusted.

The pull-up circuit 18 includes a logic circuit 44, an output circuit 46, and a voltage doubling circuit 48. The pull-up circuit 18 receives the data and enable signals 28, 32, and selectively provides current to and pulls up the voltage of the output terminal DQ1.

The logic circuit 44 includes a NOR gate 50 that receives the data signal DRQ* and the enable signal QED*. A high value for signal QED* will disable the buffer 15, while a low value for QED* will enable the buffer 15. The NOR gate 50 provides a signal to the voltage doubling circuit 48 and to an inverter 52, which provides a signal to the output circuit 46 and the voltage doubling circuit 48.

The output circuit 46 includes a first current driver 54, which provides current to a node 55, and a second current driver 56, which removes current from the node 55. The first current driver 54 controls current supplied by the voltage doubling circuit 48, as described hereinbelow. The voltage at the node 55 controls an output current driver 58. The output circuit 46 receives a signal from the inverter 52 and provides that signal to the gates of the first and second current drivers 54, 56. A low signal will cause current to flow through the first current driver 54, raising the voltage at the node 55. When the voltage at the node 55 is high, the output current driver 58 will conduct current, pulling up the voltage at output terminal DQ1. A high signal from the inverter 52 will cause the current to flow through the second current driver 56, causing the voltage of the node 55 to decrease. A low voltage at the node 55 will place the output current driver 58 in a non-conducting state, thereby preventing the signal at output terminal DQ1 from being pulled up.

The voltage doubling circuit 48 includes a first inverter 60, a second inverter 62, a first transistor 64, a second transistor 66, and a boot capacitor 68. The voltage doubling circuit 48 provides an increased voltage to the output circuit 46, thereby allowing VCCX to be present at output terminal DQ1, notwithstanding voltage losses caused by the turn-on voltage for the output current driver 58. The first inverter 60 receives the signal from NOR gate 50, and provides both inverted and non-inverted signals. The inverter 60 provides a high signal to the gate of transistor 64 when the NOR gate 50 provides a low signal, thereby causing current to flow through the first transistor 64 and charging node 72 to voltage VCCR. At approximately the same time, inverter 52 provides a high signal, causing inverter 62 to provide a low signal to node 70. When the output of the NOR gate 50 transitions from a low signal to a high signal, the inverter 60 produces a low signal at the gate terminal of transistor 64, the inverter 52 produces a low signal, and the inverter 62 produces a high signal at node 70. As a result of the change in voltage at node 70, node 72 is charged to approximately 2VCCR as current flows from node 70 to node 72 across the boot capacitor according to the equation $$i = C * dv/dt,$$

wherein C is the capacitance of the boot capacitor 68, and dv/dt is the change in voltage across the boot capacitor 68 with time. The increased voltage at node 72 allows for an increased voltage at the node 55, providing VCCX plus the bias needed to turn on the output current driver 58. Thus, despite the bias voltage drop across the output current driver 58, VCCX is available at output DQ1.

Figure 3:
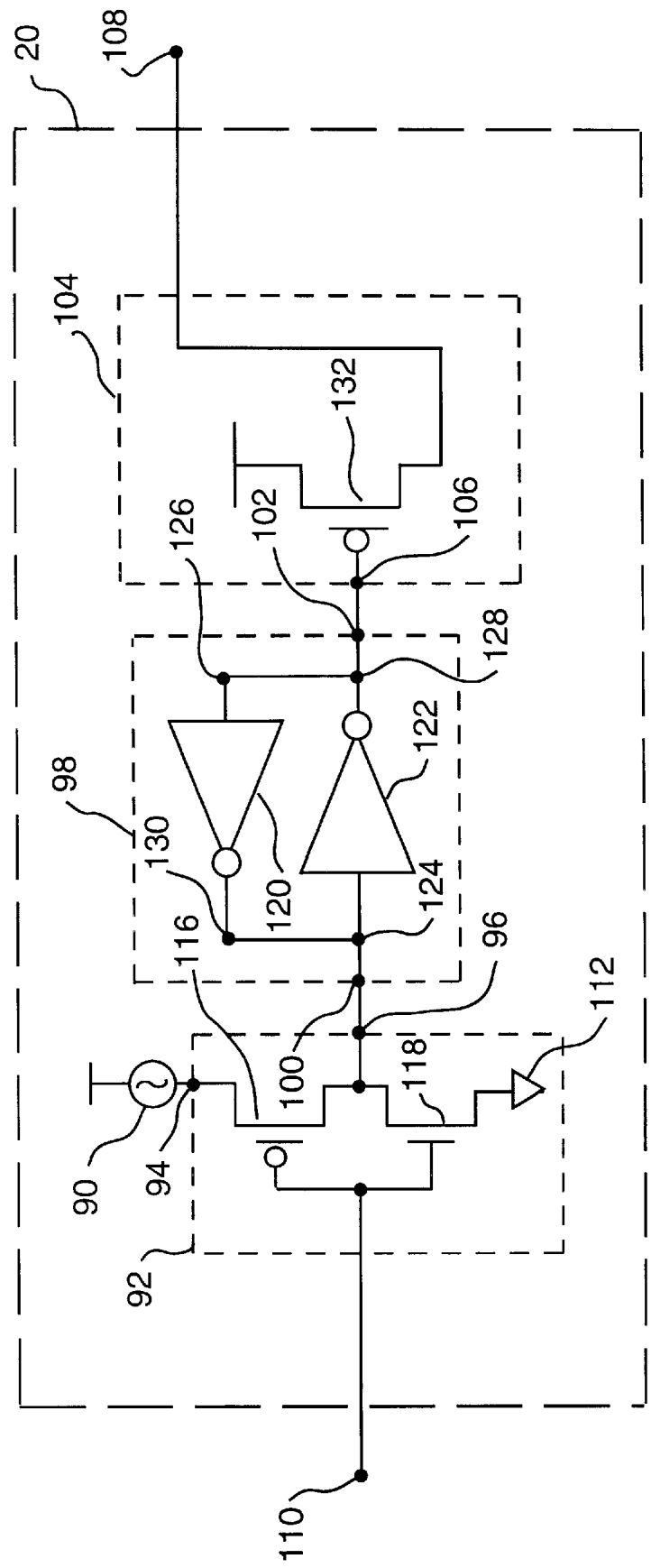
FIG. 3 is a circuit schematic illustrating the enable circuit of the output buffer of FIG. 2.

FIG. 3 is a circuit schematic illustrating the enable circuit 20 of FIG. 2. The enable circuit 20 includes a memory element 90, a read circuit 92, a latch 98, and an output circuit 104. The enable circuit 20 may also include an enable terminal 110 for receiving an enable signal. For example, the enable terminal 110 may receive a "power-up" signal, signifying that the regulated voltage is at a safe level for operation of the enable circuit 20. The power-up signal may be, for example, POWERUP*, which rises as the internal voltages VCCR, VCCP, VBB of the buffer rise to normal operating levels during power up. When internal voltages VCCR, VCCP, VBB reach a normal operating level, the POWERUP* signal goes low and the enable circuit 20 is enabled. One advantage of using the enable terminal 110 is that it prevents the gate voltages on the transistors 116, 118 from floating. If the gate voltages float, both transistors 116, 118 may be turned on at the same time, thereby creating a low resistance path from power to ground.

The memory element 90 stores data indicative of whether an additional current driver, such as the second current driver 38 in FIG. 2, is to be enabled. The memory element 90 may be, for example, a fuse, such as an electrical fuse, a laser fuse, an anti-fuse, or a software fuse. In the illustrated embodiment, the memory element 90 is conductive when the second current driver 38 is to be enabled, and is non-conductive when the second current driver 38 is to be disabled.

The read circuit 92 includes an input terminal 94 connected to the memory element 90, and an output terminal 96 to which the read circuit 92 provides a signal indicative of the state of memory element 90. The read circuit 92 may be implemented, for example, as a transistor circuit using a complementary MOS technology (CMOS). Where the read circuit 92 is implemented using CMOS technology, as in the illustrated embodiment, the drain of the first transistor 116 acts as the input terminal 94 of read circuit 92, and the source of the second transistor 118, which is connected to the source of the first transistor 116, acts as the output terminal 96 of the read circuit 92. Furthermore, the CMOS technology used in this embodiment may be of an n-type, a p-type, or an inverter type, which combines one n-type and one p-type. The read circuit 92 may also be implemented using bipolar-junction transistors (BJT).

Alternatively, the transistor 116 and enable terminal 110 may be eliminated and the read circuit 92 may be implemented as a single transistor 118. In that embodiment, transistor 118 is connected directly to the memory element 90. Where the read circuit 92 is implemented as a single transistor 118, the drain of the MOS transistor 118 acts both as the input terminal 94 of read circuit 92, and the output terminal 96 of the read circuit 92. Where the read circuit 92 is implemented using a BJT transistor, the collector of the BJT transistor acts both as the input terminal 94 of read circuit 92, and the output terminal 96 of the read circuit 92.

The latch 98 has an input terminal 100 and an output terminal 102. The latch 98 receives a signal from the read circuit 92, latches that signal, and provides an output signal indicative of the signal received from the read circuit 92. The latch 98 may include a first inverter 120 and a second inverter 122, each with an input terminal, 124, 126, and each with an output terminal, 128, 130. The first inverter 120 and second inverter 122 are connected in parallel, such that the input terminal 126 of the first inverter 120 is in an opposed orientation with respect to the input terminal 124 of the second inverter 122.

The output circuit 104 is responsive to the signal provided by the latch 98, and selectively provides current to the second current driver 38 (illustrated in FIG.2). The output circuit 104 has an input terminal 106 connected to the output terminal 102 of the latch 98, and an output terminal 108 connected to the second current driver 38 (illustrated in FIG. 2). The output circuit 104 provides current to the output terminal 108 when an active low signal is present at the input terminal 106. Such a signal is present when the memory element 90 is in a conductive state. When the output circuit is implemented using a MOS transistor 132, as in the illustrated embodiment, the output terminal 102 of the latch 98 may be connected to the gate of the MOS transistor 132, and the output terminal 108 of the output circuit 104 may be connected to the source of the transistor 132. The output circuit 104 may also be implemented, for example, using bipolar-junction or CMOS technology.

The enable circuit 20 may be used to adjust the slew rate of the buffer 15. The need for such adjustment may be ascertained after an integrated circuit containing the buffer 15 has been fabricated, by measuring the slew rate of the buffer 15 without the second current driver 38 enabled. The slew rate of the buffer 15 may be adjusted before packaging, for example, when a laser fuse is used, or after packaging when an anti-fuse is used. Alternatively, the slew rate of the buffer 15 may be adjusted both before and after packaging by using a combination of fuses, for example to compensate for changes that may be caused by the packaging process.

If the pull-down slew rate needs to be increased, the memory element 90 may be programmed to enable the second current driver 38, thereby providing additional current to the node 39 and increasing the pull-down slew rate. In contrast, if the pull-down slew rate is acceptable without enabling of the second current driver 38, the memory element 90 may be left in its non-enabled state, precluding enabling of the second current driver 38 and, thereby, not affecting the pull-down slew rate. The slew rate may be assessed, for example, by testing the slew rate before the second current driver 38 is enabled. Alternatively, if the second current driver 38 is normally enabled, the slew rate may be assessed by biasing the enable terminal 110 to disable the enable circuit 20 and to allow for testing of the slew rate of the buffer 15 without the second current driver 38. The enable terminal 110 may be biased, for example, by connecting the enable terminal 110 to the device's 10 internal test circuitry so that the bias of the enable terminal may be controlled during testing of the device 10.

Figure 4:
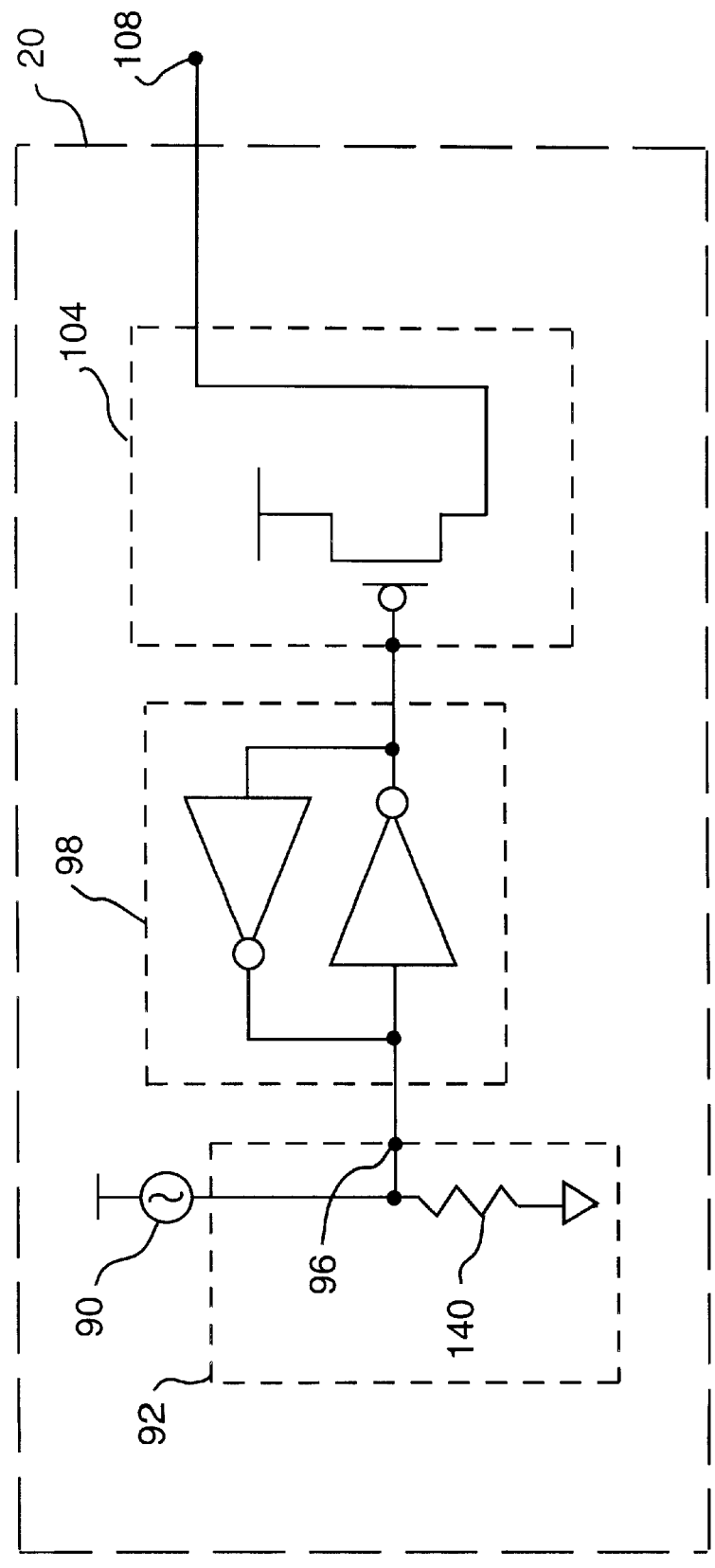
FIG. 4 is a circuit schematic illustrating an alternative embodiment of the enable circuit.

FIG. 4 is an alternative embodiment of the enable circuit 20. The read circuit 92 includes a resistor 140 in place of transistors 116, 118 (illustrated in FIG. 3) and the enable terminal 110 (also illustrated in FIG. 3) is omitted. The resistor 140 has a sufficiently high value that, when the memory element 90 provides current to the read circuit 92, a high signal will be present at the output terminal 96. However, when the memory element 90 does not provide current to the read circuit 92, the resistor 140 pulls down the signal at the output terminal to a low value.

Figure 5:
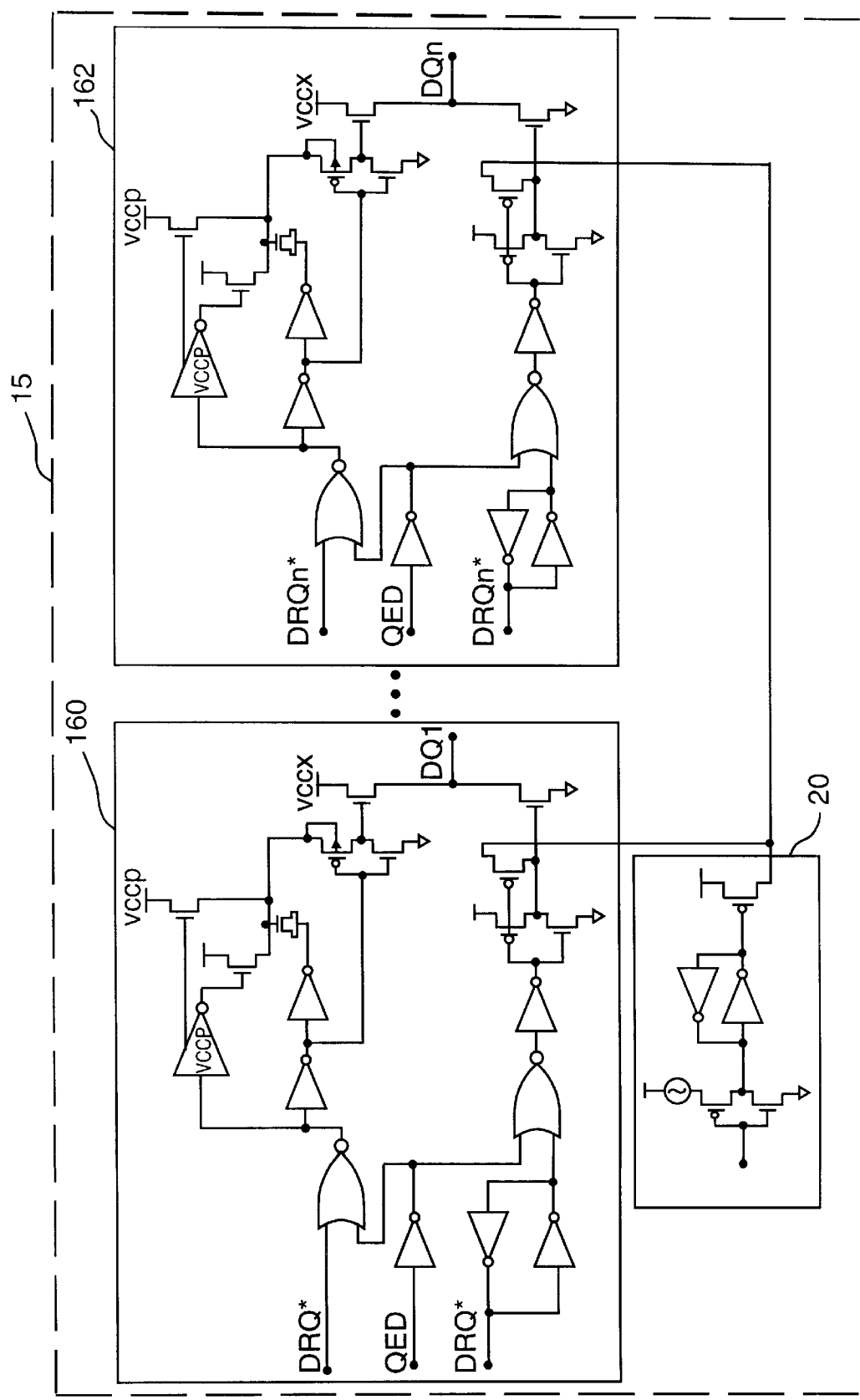
FIG. 5 is a circuit schematic illustrating a single enable circuit used to adjust slew rates in a plurality of circuits.

FIG. 5 is a circuit schematic illustrating an alternative embodiment of the buffer 15. A single enable circuit 20 controls a plurality of combination pull-up/pull-down circuits 160, 162. The enable circuit 20 may be connected to any number of circuits 160, 162, as long as sufficient current bias is provided by the enable circuit 20. That arrangement allows for a savings in die space, as well as a savings in the number of memory elements necessary for each application.

Figure 6:
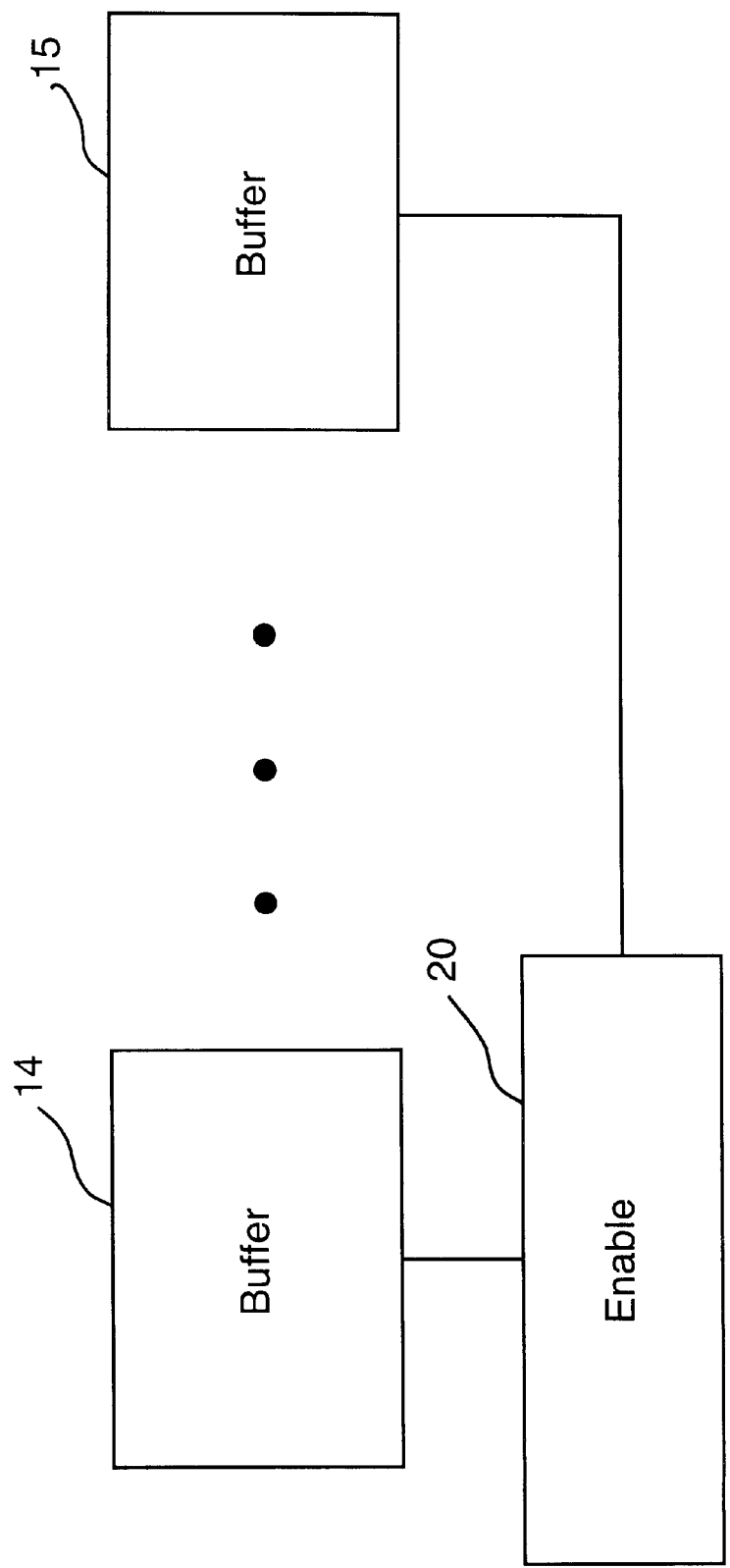
FIG. 6 is a block diagram illustrating an alternative embodiment of the buffer wherein the enable circuit is separate from the buffer.

FIG. 6 is block diagram illustrating an alternative embodiment of the present invention, wherein the enable circuit 20 is separate from the buffers 14, 15. In that embodiment, the enable circuit 20 is used to enable a plurality of buffers 14, 15, although a separate enable circuit 20 may also be used to enable a single buffer 15. The enable circuit 20 may have a single memory element 90 so that buffers 14, 15 are controlled together, or it may have a plurality of memory elements 90 so that the buffers 14, 15 may be controlled separately.

Figure 7:
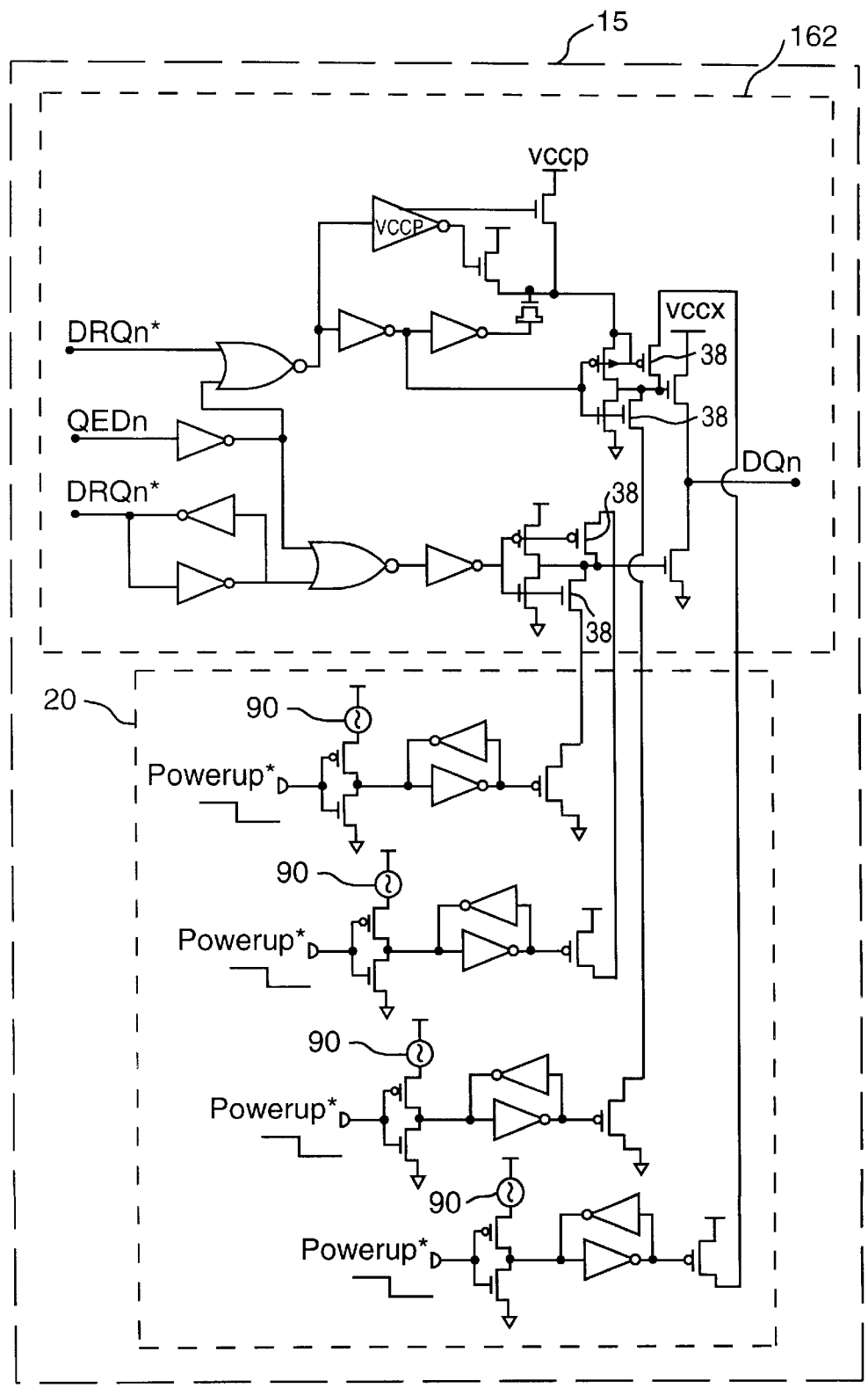
FIG. 7 is a circuit schematic illustrating an alternative embodiment of the buffer, wherein an enable circuit controls a plurality of combination pull-up/pull-down circuits.

FIG. 7 is a circuit schematic illustrating an alternative embodiment of the buffer 15. The enable circuit 20 controls a plurality current drivers that may be used to adjust slew rate in both pull-up and pull-down circuits. The enable circuit 20 includes a separate memory element 90 for each current driver so that various aspects of slew rate may be independently adjusted.

Figure 8:
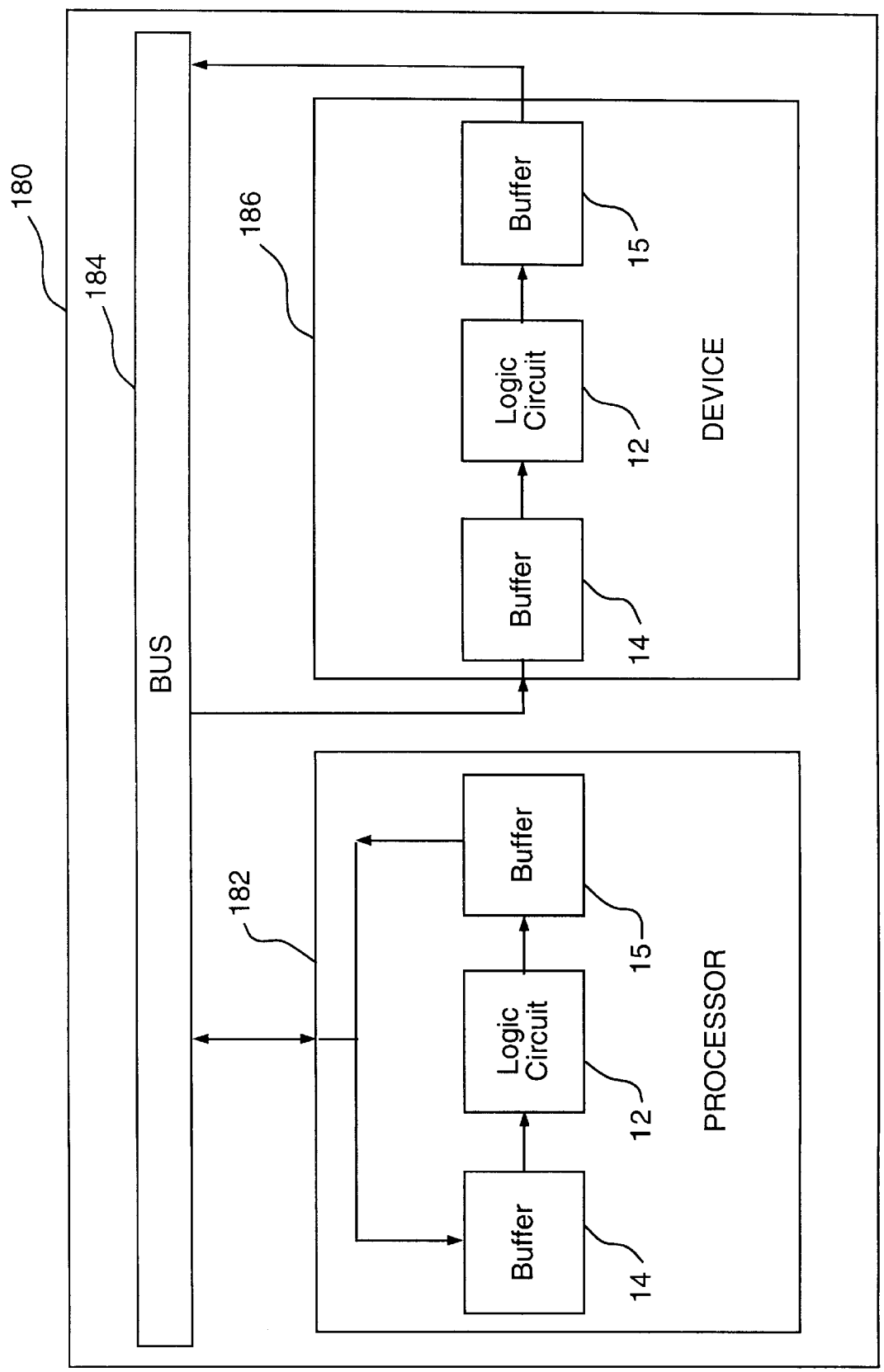
FIG. 8 is a high level block diagram illustrating a system embodying the present invention.

FIG. 8 is a high level block diagram illustrating a system 180 including a first device 182, a bus 184, and a second device 186. The system 180 may be, for example, a memory system or a computer system. The first device 182 may be a processor, and the second device 186 may be a memory. The first device 182 and the second device 186 may communicate via the bus 184. The first and second devices 182, 186 may include a logic circuit 12, an input buffer 14, and an output buffer 15. The logic circuit 12, input buffer 14, and output buffer 15 may have adjustable slew rates according to the teaching of the present invention.

Those of ordinary skill in the art will recognize that many modifications and variations of the present invention and its applications may be implemented. For example, the elements of the pull-up and pull-down circuits may be interchanged or reversed to form alternative embodiments of the present invention. For example, the current drivers controlled by the enable circuit may be included in one or both of the pull-up and pull-down circuits. In addition, the enable circuit 20 may be integral to or separate from the circuit in which it adjusts slew rate, and the enable circuit 20 may be used with other than a pull-up or a pull-down circuit. Also, additional enable circuits 20 for controlling additional current drivers in parallel with those illustrated herein may also be provided to allow slew rate to be adjusted with greater precision. Greater or fewer enable circuits 20, and greater or fewer current drivers may also be provided. The foregoing description and the following claims are intended to cover all such modifications, variations, and applications.

What is claimed is:

1. A buffer, comprising:
   a current driver including an input terminal; and
   an enable circuit, including:
      a memory element having an output terminal;
      a read circuit having an input terminal connected to the output terminal of said memory element and having an output terminal;
      a latch having an input terminal connected to the output terminal of said read circuit, and having an output terminal; and
      an output circuit having an input terminal connected to the output terminal of said latch and having an output terminal connected to the input terminal of said current driver.

2. A buffer, comprising:
   a current driver having an input terminal; and
   an enable circuit, including:
      a memory element;
      a read circuit connected to said memory element;
      a latch connected to said read circuit; and
      an output circuit connected to said latch and connected to said input terminal of said current driver.

3. The buffer of claim 2, wherein said read circuit includes at least one transistor.

4. The buffer of claim 3, wherein the at least one transistor of said read circuit is selected from a group consisting of a MOS transistor and a BJT transistor.

5. The buffer of claim 2, wherein said read circuit includes a CMOS circuit.

6. The buffer of claim 2, wherein said read circuit includes a resistor connected to said memory element.

7. The buffer of claim 6, wherein the resistor of said read circuit includes:
   a first end connected to a reference voltage; and
   a second end connected to both said memory element and said latch.

8. The buffer of claim 7, wherein the reference voltage is ground.

9. The buffer of claim 2, wherein said latch includes a first inverter and a second inverter.

10. The buffer of claim 2, wherein said output circuit includes a transistor.

11. The buffer of claim 10, wherein the transistor of said output circuit is selected from a group comprising a MOS transistor and a BJT transistor.

12. The buffer of claim 10, wherein said output circuit includes a CMOS circuit.

13. A buffer, comprising:
    a current driver including an input terminal, and
    an enable circuit, including:
       a memory element having a state,
       a circuit having an input terminal connected to said memory element, a read circuit connected to said memory element, a latch connected to said read circuit, an output circuit connected to said latch, and an output terminal connected to the output circuit and connected to the input terminal of said current driver, and providing at the output terminal an output signal indicative if the state of the memory element.

14. A device, comprising:
    a logic circuit; and
    a buffer connected to said logic circuit, said buffer including:
       a current driver including an input terminal; and
       an enable circuit, including:
          a memory element having an output terminal;
          a read circuit having an input terminal connected to the output terminal of said memory element and having an output terminal;
          a latch having an input terminal connected to the output terminal of said read circuit, and having an output terminal; and
          an output circuit having an input terminal connected to the output terminal of said latch and having an output terminal connected to the input terminal of said current driver.

15. A memory device, comprising;
    a memory array; and
    a buffer connected to said memory array, said buffer including:
       a first current driver;
       a second current driver including an input terminal; and
       an enable circuit, including:
          a memory element,
          a read circuit having an input terminal connected to the memory element and having an output terminal,
          a latch having an input terminal connected to the output terminal of the read circuit, and having an output terminal, and
          an output circuit having an input terminal connected to the output terminal of the latch and having an output terminal connected to the input terminal of said second current driver.

16. A system, comprising:
    a data bus;
    at least one device including:
       a control circuit; and
       a buffer including:
          a first current driver;
          a second current driver including an input terminal; and an enable circuit, including:
  a memory element,
  a read circuit having an input terminal connected to the memory element and having an output terminal,
  a latch having an input terminal connected to the output terminal of the read circuit, and having an output terminal, and
  an output circuit having an input terminal connected to the output terminal of the latch and having an output terminal connected to the input terminal of said second current driver.

17. An enable circuit for use with a buffer having a plurality of current drivers that are responsive to enable signals, comprising:

a plurality of memory elements, each having a state, wherein each memory element corresponds to one of the current drivers;

a plurality of latches, each connected to one of said read circuits;

a plurality of read circuits, each connected to one of said memory elements;

an plurality of output circuits, each connected to one of said latches, each responsive to one of said latchs and each producing an enable signal.

* * * * *

UNITED STATES PATENT AND TRADEMARK OFFICE
CERTIFICATE OF CORRECTION

PATENT NO. : 6,157,204
DATED : December 5, 2000
INVENTOR(S) : Sher et al.

It is certified that error appears in the above-identified patent and that said Letters Patent is hereby corrected as shown below:

Abstract, title page,
Line 3, after the word "selectively", delete the word "enables" and substitute the word --enable-- therefor.

Column 6,
Line 51, between the words "is" and "block", insert the article -- a --.
Line 63, between the words "plurality" and " current", insert the word -- of --.

Column 8,
Line 23, after the word "indicative", delete the word "if" and subtitute the word -- of -- therefor.

Column 10,
Line 10, before the word "plurality", delete the word "an" and substitute the article -- a -- therefor.

Signed and Sealed this

Twenty-fifth Day of September, 2001

Attest:

NICHOLAS P. GODICI
Attesting Officer  Acting Director of the United States Patent and Trademark Office